(12) United States Patent
Taka et al.

(10) Patent No.: US 8,797,743 B2
(45) Date of Patent: Aug. 5, 2014

(54) FIXING STRUCTURE FOR HEAT SOURCE ELEMENT AND HEAT CONDUCTING MEMBER, AND METHOD OF FIXING HEAT SOURCE ELEMENT AND HEAT CONDUCTING MEMBER

(75) Inventors: Yoichiro Taka, Okazaki (JP); Masashi Takano, Okazaki (JP); Tarou Aikawa, Okazaki (JP)

(73) Assignee: Aisin Aw Co., Ltd., Anjo (JP)

( * ) Notice: Subject to any disclaimer, the term of this patent is extended or adjusted under 35 U.S.C. 154(b) by 354 days.

(21) Appl. No.: 13/298,894

(22) Filed: Nov. 17, 2011

(65) Prior Publication Data

US 2012/0140418 A1 Jun. 7, 2012

(30) Foreign Application Priority Data

Dec. 1, 2010 (JP) ................................. 2010-268838

(51) Int. Cl.
H05K 7/20 (2006.01)
(52) U.S. Cl.
CPC .................................. H05K 7/20154 (2013.01)
USPC .......................................... 361/710; 257/726
(58) Field of Classification Search
USPC ......... 361/679.46, 679.47, 709, 710; 257/726
See application file for complete search history.

(56) References Cited

U.S. PATENT DOCUMENTS

| | | | | |
|---|---|---|---|---|
| 4,575,038 A * | 3/1986 | Moore | ........................... | 248/505 |
| 4,674,005 A | 6/1987 | Lacz | | |
| 5,130,888 A * | 7/1992 | Moore | ........................... | 361/717 |
| 5,225,965 A * | 7/1993 | Bailey et al. | ................... | 361/704 |
| 5,327,324 A * | 7/1994 | Roth | .............................. | 361/707 |
| 5,343,362 A * | 8/1994 | Solberg | ......................... | 361/710 |
| 5,909,358 A * | 6/1999 | Bradt | .............................. | 361/707 |
| 6,081,424 A * | 6/2000 | Mach et al. | ................... | 361/704 |
| 6,181,556 B1* | 1/2001 | Allman | ......................... | 361/690 |
| 6,183,284 B1* | 2/2001 | Gill et al. | ...................... | 439/327 |
| 6,201,699 B1* | 3/2001 | Ayres et al. | .................... | 361/707 |
| 6,431,259 B2* | 8/2002 | Hellbruck et al. | ........... | 165/80.3 |
| 6,801,432 B2* | 10/2004 | Petricek | ........................ | 361/704 |
| 7,151,669 B2* | 12/2006 | Liu | .................................. | 361/707 |
| 7,180,739 B2* | 2/2007 | Kajiura | ......................... | 361/695 |
| 7,221,569 B2* | 5/2007 | Tsai | ................................. | 361/704 |

(Continued)

FOREIGN PATENT DOCUMENTS

JP U-58-187192 12/1983
JP A-61-212100 9/1986

(Continued)

OTHER PUBLICATIONS

Dec. 13, 2013 Notification of Reason(s) for Refusal issued in Japanese Patent Application No. 2010-268838 (with partial English Translation).

*Primary Examiner* — Adrian S Wilson
(74) *Attorney, Agent, or Firm* — Oliff PLC

(57) ABSTRACT

An electronic device mounted on a circuit board and accommodated in a housing includes a heat source element accommodated in the housing and mounted on the circuit board, and a heat conducting member accommodated in the housing. The heat conducting member is movably mounted on the circuit board. An elastic member fixes the heat source element and the heat conducting member in abutment with each other. The elasticity of the elastic member permits variations in the relative positions of the heat source element and the heat conducting member while maintaining the abutment of the heat source element and the heat conducting member.

16 Claims, 6 Drawing Sheets

(56) References Cited

U.S. PATENT DOCUMENTS

| | | | |
|---|---|---|---|
| 7,349,220 B2* | 3/2008 | Lai et al. | 361/719 |
| 7,375,964 B2* | 5/2008 | Lai et al. | 361/704 |
| 7,391,613 B2* | 6/2008 | Lai et al. | 361/700 |
| 7,400,506 B2* | 7/2008 | Hoss et al. | 361/715 |
| 7,532,477 B2* | 5/2009 | Hsu | 361/704 |
| 7,660,114 B2* | 2/2010 | Watanabe et al. | 361/690 |
| 7,684,197 B2* | 3/2010 | Zhu et al. | 361/719 |
| 7,817,426 B2* | 10/2010 | Tamori | 361/704 |
| 7,845,994 B2* | 12/2010 | Maschke et al. | 439/883 |
| 2001/0019913 A1* | 9/2001 | Llapitan et al. | 439/327 |
| 2004/0017662 A1* | 1/2004 | Liu | 361/719 |

FOREIGN PATENT DOCUMENTS

| | | |
|---|---|---|
| JP | U-03-059643 | 6/1991 |
| JP | U-081639 | 8/1991 |
| JP | U-07-029894 | 6/1995 |
| JP | U-30055404 | 10/1998 |
| JP | A-2003-229522 | 8/2003 |
| JP | A-2006-294952 | 10/2006 |

* cited by examiner

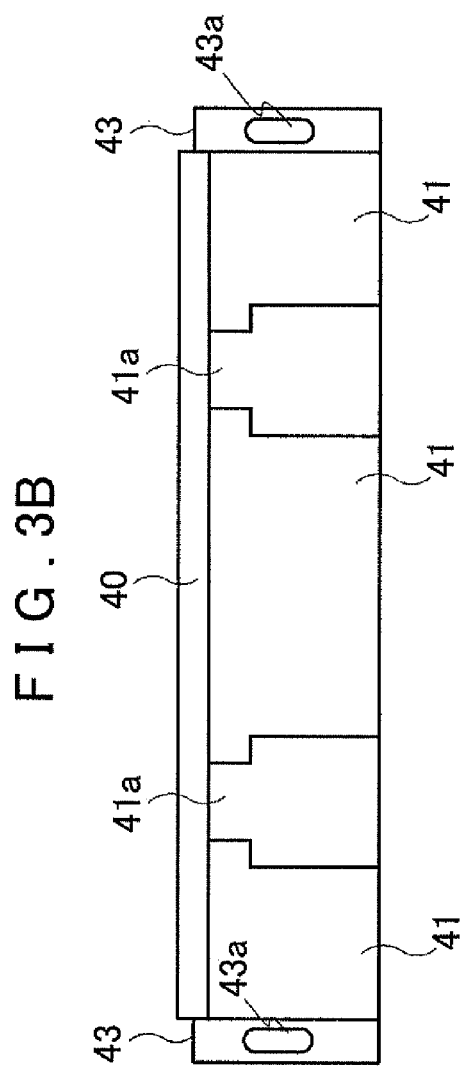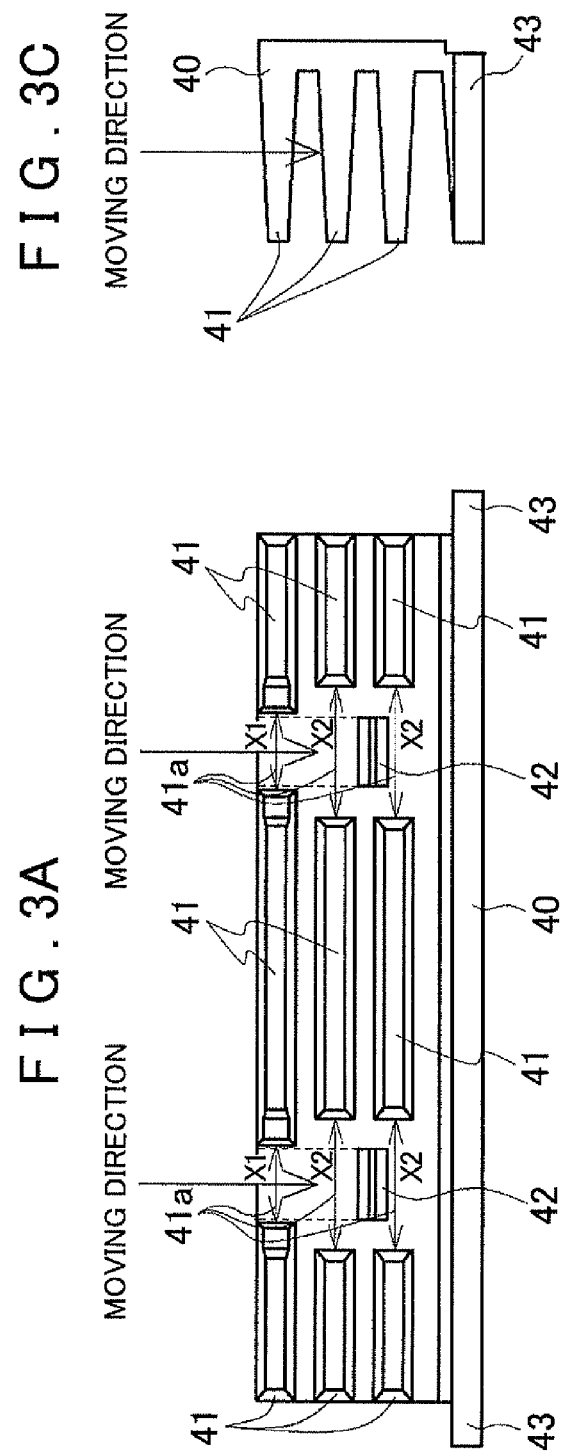

F I G. 4A
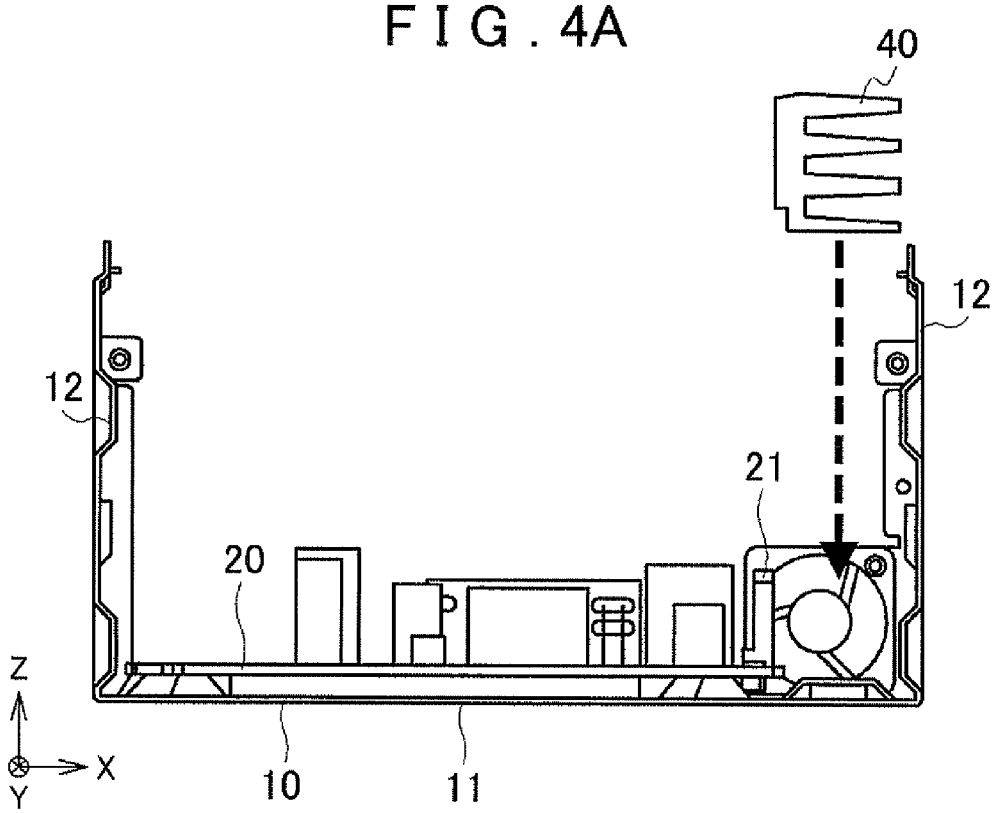
F I G. 4B
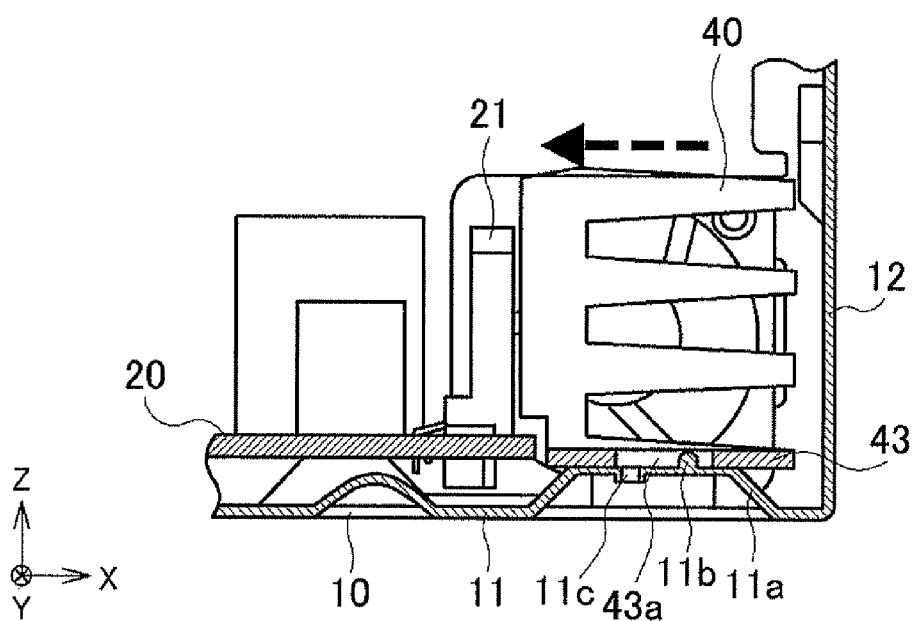

FIXING STRUCTURE FOR HEAT SOURCE ELEMENT AND HEAT CONDUCTING MEMBER, AND METHOD OF FIXING HEAT SOURCE ELEMENT AND HEAT CONDUCTING MEMBER

INCORPORATION BY REFERENCE

The disclosure of Japanese Patent Application No. 2010-268838, filed on Dec. 1, 2010, including the specification, drawings, and abstract is incorporated herein by reference in its entirety.

BACKGROUND

1. Related Technical Fields

Related technical fields include fixing structures for fixing a heat source element and a heat conducting member, and methods of fixing a heat source element and a heat conducting member.

2. Related Art

A heat source element such as an amplifier IC and a power regulator is mounted on an audio circuit board used in car navigation systems, for example. In recent years, in particular, the amount of heat generated by the heat source element has been increasing along with an increase in output produced by the heat source element, and thus it has been desired to take appropriate measures against heat.

A heat radiating structure for an electronic device that brings a heat source element into press contact with a heat sink for heat radiation using a bracket is proposed, for example. In this structure, an engagement piece provided on the bracket which supports the heat source element is inserted into a notch provided in the heat sink. A pressing engagement portion provided in the notch draws the engagement piece of the bracket to draw the heat source element toward the heat sink via the bracket (see Japanese Patent Application Publication No. JP-A-2003-229522, for example).

SUMMARY

In order to radiate heat generated by the heat source element such as an amplifier IC and a power regulator using a heat conducting member such as the heat sink, it is necessary to securely fix the heat source element to the heat conducting member such as the heat sink. In this case, respective contact surfaces of the heat source element and the heat sink may vary in position because of the dimensional tolerance and the assembly tolerance of the heat source element and the heat sink. Therefore, it is required that the fixing structure for the heat source element and the heat conducting member should be able to securely fix the heat source element and the heat sink by absorbing such variations, and that the fixing work should be performed easily. In the structure according to the related art discussed above, however, the heat source element and the heat sink must be brought into press contact with each other by fixing the bracket to the heat source element mounted on the audio circuit board and further to the heat sink, and thus the fixing work is troublesome. In addition, in order to correctly insert the engagement piece of the bracket into the notch provided in the heat sink, the heat source element, the bracket, and the heat sink must be installed at their respective correct positions, and thus the positioning work is also troublesome. Further, in the case where a plurality of heat source elements are provided, it is necessary to consider the dimensional tolerance and the assembly tolerance for each of the heat source elements as discussed above. Therefore, each of the heat source elements must be attached to the heat sink using a bracket that enables individual position adjustment for the heat source element, which may further complicate the fixing work.

Exemplary implementations of the broad inventive principles described herein provide a fixing structure for a heat source element and a heat conducting member and a method of fixing a heat source element and a heat conducting member that allow easy and secure fixation of the heat source element and the heat conducting member while absorbing variations in fixing position due to the dimensional tolerance and the assembly tolerance of the heat source element and the heat conducting member.

According to exemplary implementations, the heat conducting member is moved toward the heat source element along a direction that is generally orthogonal to a surface of the heat conducting member for abutment with the heat source element to be brought into abutment with the heat source element; and the heat source element and the heat conducting member, which have been brought into abutment with each other, are held by an elastic member to fix the heat source element and the heat conducting member to each other. Thus, it is possible to securely fix the heat source element and the heat conducting member to each other through easy work including holding the heat source element and the heat conducting member with the elastic member, while absorbing variations in fixing position due to the dimensional tolerance and the assembly tolerance of the heat source element and the heat conducting member through deformation of the elastic member.

According to exemplary implementations, the heat source element may be mounted on a circuit board such that a surface of the heat source element for abutment with the heat conducting member extends generally in parallel with a side surface portion of a housing; and the elastic member may be moved toward the heat source element and the heat conducting member along a direction that is generally orthogonal to a bottom surface portion to be disposed at a position at which the elastic member holds the heat source element and the heat conducting member. Thus, in order to place the elastic member at its holding position, the elastic member can be provided into the housing along the direction that is generally orthogonal to the bottom surface portion, and there is no need to perform work from directions other than the direction that is generally orthogonal to the bottom surface portion. Thus, the heat source element and the heat conducting member can be fixed to each other through simple and easy working procedures.

According to exemplary implementations, the heat conducting member may include a heat radiating fin extending generally orthogonally to a direction in which the elastic member is moved to be disposed at the position at which the elastic member holds the heat source element and the heat conducting member; and the heat radiating fin may be provided with a notched portion extending along the moving direction of the elastic member and having a width that is larger than a width of the elastic member. Thus, the heat source element and the heat conducting member can be securely fixed to each other by the elastic member while improving the heat radiation capability through the heat radiating fin.

According to exemplary implementations, the notched portion provided in the heat radiating fin, of a plurality of the heat radiating fins, that is first approached by the elastic member when the elastic member is moved toward the position at which the elastic member holds the heat source element and the heat conducting member may have a width that is smaller than a width of the notched portions in the other heat radiating fins. Thus, portions that surround the notched portions of the heat radiating fin that is first approached by the elastic member restrict movement of the elastic member in directions other than the moving direction of the elastic member. In addition, the elastic member is prevented from being caught by the heat radiating fins other than the heat radiating fin that is first approached by the elastic member. Thus, the elastic member can be disposed at its holding position easily.

According to exemplary implementations, the elastic member may include a projection that is brought into abutment with the heat conducting member with the elastic member holding the heat source element and the heat conducting member; and the heat conducting member may include a recess provided in the notched portion to be fitted with the projection. Thus, the elastic member can be disposed at an appropriate position easily and securely.

According to exemplary implementations, a plurality of the heat source elements may be mounted on the circuit board, and the plurality of the heat source elements and the single heat conducting member may be brought into abutment with other. Thus, the plurality of the heat source elements can be fixed to the heat conducting member easily with no need to individually position a plurality of the heat source elements and a plurality of the heat conducting members with respect to each other.

According to exemplary implementations, the elastic member may be movable in a range in which there are no terminals of the heat source element for connection with the circuit board or no elements mounted on the circuit board other than the heat source element. Thus, variations in fixing position due to the dimensional tolerance and the assembly tolerance of the heat source element and the heat conducting member can be absorbed through movement of the elastic member while preventing the elastic member from contacting the elements other than the heat source element or the connection terminals of the heat source element.

BRIEF DESCRIPTION OF THE DRAWINGS

FIGS. 2A, 2B and 2C are views showing a clip according to the example as viewed from three directions, in which FIGS. 2A, 2B, and 2C are a front view, a plan view, and a side view, respectively, of the clip;

FIGS. 3A, 3B and 3C are views showing a heat sink according to the example as viewed from three directions, in which FIGS. 3A, 3B, and 3C are a front view, a plan view, and a side view, respectively, of the heat sink;

FIGS. 4A and 4B are views illustrating an abutting process in which heat source elements and the heat sink are brought into abutment with each other, in which FIG. 4A is a side cross-sectional view showing a process in which the heat sink is accommodated in a housing, and FIG. 4B is an enlarged side cross-sectional view showing a process in which the heat source elements and the heat sink are brought into abutment with each other;

FIGS. 5A and 5B are views illustrating a fixing process in which the heat source elements and the heat sink are fixed to each other, in which FIG. 5A is a perspective view showing a process in which clips are moved toward the heat source elements and the heat sink, and FIG. 5B is an enlarged side view showing the process in which the clips are moved toward the heat source elements and the heat sink.

DETAILED DESCRIPTION OF EXEMPLARY IMPLEMENTATIONS

A fixing structure for a heat source element and a heat conducting member and a method of fixing a heat source element and a heat conducting member will be described in detail below with reference to the drawings The fixing structure for a heat source element and a heat conducting member and the method of fixing a heat source element and a heat conducting member may be applied to any electronic device such as a navigation device and an audio device installed in an automobile, for example. In the example, the fixing structure for a heat source element and a heat conducting member and the method of fixing for a heat source element and a heat conducting member are applied to an audio device.

I. CONFIGURATION

Figure 1:
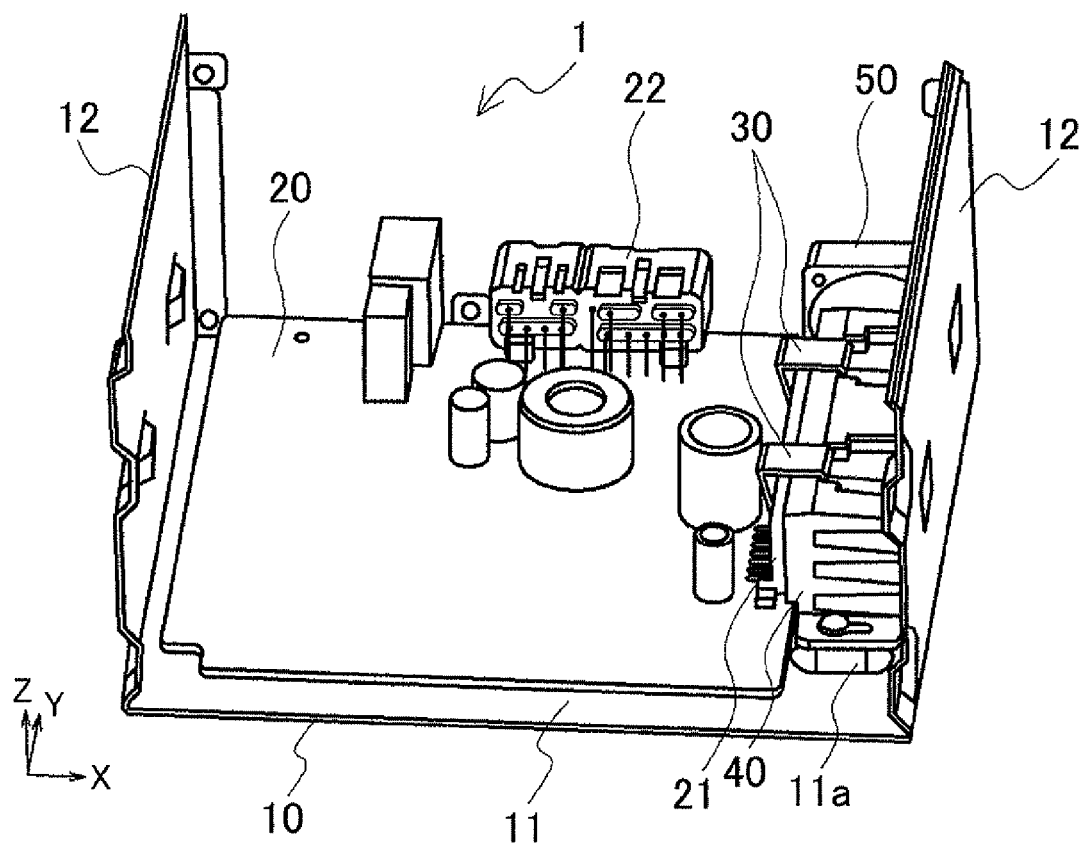
FIG. 1 is a perspective view of an audio device.

First, the basic configuration of the audio device will be described. FIG. 1 is a perspective view of the audio device. As shown in FIG. 1, the audio device 1 includes a housing 10, a circuit board 20, clips 30 (elastic members), a heat sink 40 (heat conducting member), and a fan 50.

A. Housing

The housing 10 includes a bottom surface portion 11 and side surface portions 12 extending generally orthogonally to the bottom surface portion 11. The bottom surface portion 11 and the side surface portions 12 are formed by pressing a single steel sheet, for example. A flange fixing portion 11a for fixation of flange portions 43 of the heat sink 40 to be discussed later is provided on the bottom surface portion 11 at a position corresponding to the flange portions 43. The flange fixing portion 11a is provided with projecting portions 11b to be inserted into long holes 43a provided in the flange portions 43 of the heat sink 40, and screw holes 11c that receive screws (not shown) for fixing the heat sink 40 to the bottom surface portion 11. After various components are accommodated inside the housing 10, a cover (not shown) that covers an open portion of the housing 10 is attached to separate the inside of the housing 10 from the outside thereof.

B. Circuit Board

The circuit board 20 is a printed wiring circuit board fixed to the housing 10 so as to extend generally in parallel with the bottom surface portion 11 of the housing 10. The circuit board 20 is accommodated in the housing 10. Various components such as heat source elements 21 that generate heat when energized to serve as heat sources such as an amplifier IC and a power regulator, a capacitor, a resistor, a coil, and a vehicle connector 22, for example, are mounted on the circuit board 20. The heat source elements 21 are mounted on the circuit board 20 with surfaces of the heat source elements 21 for abutment with the heat sink 40 extending generally in parallel with the side surface portion 12 of the housing 10. In the example of FIG. 1, two heat source elements 21 are disposed side by side at an end portion of the circuit board 20 on the +X side. The two heat source elements 21 are mounted on the circuit board 20 with a surface of each of the heat source elements 21 for abutment with the heat sink 40 (in FIG. 1, the surface on the +X side) extending generally in parallel with the side surface portion 12 of the housing 10 on the +X side. A connector (not shown) of a connection cable for mutual connection between the audio device 1 and other in-vehicle devices such as a navigation device is inserted into the vehicle connector 22.

C. Clip

Figure 2B:
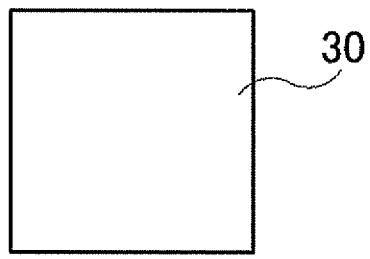
Figure 2A:
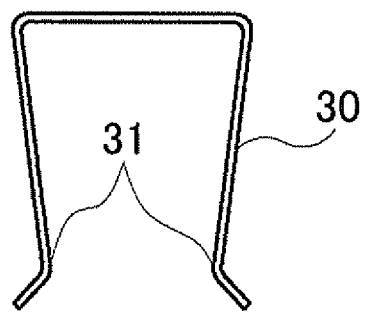
Figure 2C:
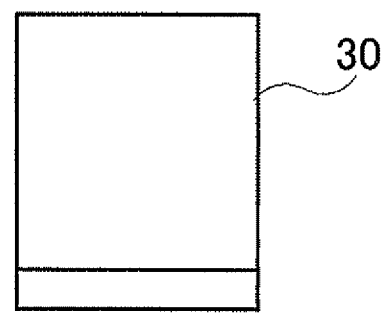

The clips 30 are each an elastic member that holds the heat source element 21 and the heat sink 40 to fix the heat source element 21 and the heat sink 40 to each other. FIGS. 2A, 2B and 2C are views showing the clip 30 according to the example as viewed from three directions. FIG. 2A is a front view of the clip 30. FIG. 2B is a plan view of the clip 30. FIG. 2C is a side view of the clip 30. As shown in FIGS. 2A, 2B and 2C, the clip 30 is formed from an elastic material such as a steel sheet, and formed to have a generally U-shaped cross section. The heat source element 21 and the heat sink 40 are held between both end portions of the clip 30 to be fixed to each other by an elastic force of the clip 30. As shown in FIG. 2A, the clip 30 includes projections 31 that are brought into abutment with the heat source element 21 and the heat sink 40 with the clip 30 holding the heat source element 21 and the heat sink 40.

D. Heat Sink

Returning to FIG. 1, the heat sink 40 is a heat conducting member that radiates heat generated by the heat source elements 21 to a different place. The heat sink 40 is accommodated in the housing 10. The heat sink 40 may be formed from a material with a high heat conductivity such as aluminum and copper, for example. A heat conducting plate, a heat pipe, or the like that transfers heat to a heat radiating portion provided at a different location may be used as a heat conducting member in place of the heat sink 40. In the example, the heat sink 40 including a plurality of heat radiating fins 41 is used as the heat conducting member.

FIGS. 3A, 3B and 3C are views showing the heat sink 40 according to the example as viewed from three directions. FIG. 3A is a front view of the heat sink 40. FIG. 3B is a plan view of the heat sink 40. FIG. 3C is a side view of the heat sink 40. As shown in FIGS. 3A, 3B and 3C, the heat sink 40 includes the plurality of heat radiating fins 41, recesses 42, and the flange portions 43. The heat sink 40 is formed to have at least such a length that enables the heat sink 40 to be brought into abutment with both the two heat source elements 21 mounted on the circuit board 20.

The heat radiating fins 41 are formed as generally flat plates extending generally orthogonally to the direction (direction of the arrows in FIGS. 3A and 3C) in which the clips 30 are moved toward positions at which the clips 30 hold the heat source elements 21 and the heat sink 40 (hereinafter referred to as "holding positions" as necessary). Each of the heat radiating fins 41 is provided with notched portions 41a provided along the direction in which the clips 30 are moved toward their holding positions and having a width that is larger than the width of the clips 30 (indicated by the dotted lines in FIG. 3A). The number of the notched portions 41a corresponds to the number of the clips 30 used (in FIGS. 3A and 3B, each of the heat radiating fins 41 is provided with two notched portions 41a). Of the notched portions 41a provided in the heat radiating fins 41, the notched portions 41a provided in the heat radiating fin 41 that is first approached by the clips 30 when the clips 30 are moved toward their holding positions (in FIGS. 3A and 3C, the uppermost heat radiating fin 41) are formed to have a width x1 that is smaller than the width x2 of the notched portions 41a in the other heat radiating fins 41. More particularly, the width x1 of the notched portion 41a provided in the heat radiating fin 41 that is first approached by the clips 30 when the clips 30 are moved toward their holding positions is fanned such that the difference between the width x1 and the width of the clips 30 is minimized, and specifically formed to be larger than the maximum allowable width of the clips 30 by a predetermined width (for example, 1 mm). Meanwhile, the width x2 of the notched portions 41a provided in the other heat radiating fins 41 is formed to be sufficiently larger than the width of the clips 30, and specifically formed to be larger than the width x1 of the notched portions 41a provided in the heat radiating fin 41 that is first approached by the clips 30 by a predetermined width (for example, 5 mm). As a result, portions that surround the notched portions 41a of the heat radiating fin 41 that is first approached by the clips 30 when the clips 30 are moved toward their holding positions restrict movement of the clips 30 in directions other than the moving direction of the clips 30 (for example, the left and right directions in FIG. 3A). In addition, the clips 30 are prevented from being caught by the other heat radiating fins 41. Thus, the heat source elements 21 and the heat sink 40 can be held by the clips 30 with improved assembly efficiency.

The recesses 42 are to be fitted with the projections 31 of the clips 30. As shown in FIG. 3A, the recesses 42 are formed in a surface of the heat sink 40 on which the heat radiating fins 41 are provided at positions corresponding to the projections 31 of the clips 30. The recesses 42 are formed to be wider than the projections 31 of the clips 30.

The flange portions 43 serve as portions to be fixed when the heat sink 40 is fixed to the bottom surface portion 11 of the housing 10. The flange portions 43 are respectively provided at both ends of the heat sink 40 on the bottom surface portion 11 side. As shown in FIG. 3B, the long holes 43a are formed in the flange portions 43. When installing the heat sink 40 on the bottom surface portion 11 of the housing 10, the projecting portions 11b of the flange fixing portion 11a are inserted into the long holes 43a, and the screws for fixing the heat sink 40 to the bottom surface portion 11 are screwed into the screw holes 11c of the flange fixing portion 11a via the long holes 43a.

A surface of the heat sink 40 that is opposite the surface provided with the heat radiating fins 41 is formed as a flat surface for abutment with the heat source elements 21.

E. Fan

Returning to FIG. 1, the fan 50 forcibly supplies an air flow to the surfaces of the heat radiating fins 41 to promote heat radiation from the heat radiating fins 41. The fan 50 is accommodated in the housing 10. In the example, as shown in FIG. 1, in order to generate an air flow along the direction (in FIG. 1, −Y direction) that is generally in parallel with the heat radiating fins 41, the fan 50 is disposed at a side of the heat sink 40 and at a position at which the fan 50 can discharge air inside the housing 10 out of the housing 10.

II. METHOD OF FIXING HEAT SOURCE ELEMENT AND HEAT SINK

Next, the fixing structure for the heat source elements 21 and the heat sink 40 and the method of fixing the heat source elements 21 and the heat sink 40 in the thus configured audio device 1 will be described. In the following description, the circuit board 20 on which the heat source elements 21 are mounted and the fan 50 are already accommodated in the housing 10.

A. Abutting Process

FIGS. 4A and 4B are views illustrating an abutting process in which the heat source elements 21 and the heat sink 40 are brought into abutment with each other. FIG. 4A is a side cross-sectional view showing a process in which the heat sink 40 is accommodated in the housing 10. FIG. 4B is an enlarged side cross-sectional view showing a process in which the heat source elements 21 and the heat sink 40 are brought into abutment with each other. Before starting the abutting process, thermally conductive grease or a thermally conductive sheet is applied to surfaces of the heat source elements 21 for abutment with the heat sink 40, or a surface of the heat sink 40 for abutment with the heat source elements 21.

First, as shown in FIG. 4A, the heat sink 40 is moved toward the bottom surface portion 11 along the direction (the dotted arrow in FIG. 4A) that is generally orthogonal to the bottom surface portion 11 to be accommodated in a space between the heat source elements 21 and the side surface portion 12. The heat sink 40 is thus accommodated in the housing 10. In this event, as shown in FIG. 4B, the heat sink 40 is disposed such that the projecting portions 11b of the flange fixing portion 11a are inserted into the long holes 43a of the flange portions 43.

Subsequently, as shown in FIG. 4B, the heat sink 40 accommodated in the housing 10 is moved toward the heat source elements 21 along the direction (the dotted arrow in FIG. 4B) that is generally orthogonal to the surface of the heat sink 40 for abutment with the heat source elements 21. The heat source elements 21 and the heat sink 40 are thus brought into abutment with each other. In the example, two heat source elements 21 are mounted on the circuit board 20, and a single heat sink 40 is brought into abutment with the two heat source elements 21. As discussed above, the projecting portions 11b of the flange fixing portion 11a are inserted into the long holes 43a of the flange portions 43. Therefore, the heat sink 40 can be moved only along the longitudinal direction of the long holes 43a (that is, the direction that is generally orthogonal to the surface of the heat sink 40 for abutment with the heat source elements 21) while keeping the surface of the heat sink 40 for abutment with the heat source elements 21 (the surface on the −X side in FIG. 4A) and the surfaces of the heat source elements 21 for abutment with the heat sink 40 (the surfaces on the +X side in FIG. 4A) generally in parallel with each other. The heat sink 40 can thus be positioned easily. After the heat source elements 21 and the heat sink 40 are brought into abutment with each other, screws (not shown) are screwed into the screw holes 11c of the flange fixing portion 11a via the long holes 43a of the flange portions 43. The heat sink 40 is thus fixed to the bottom surface portion 11.

B. Fixing Process

Figure 5A:
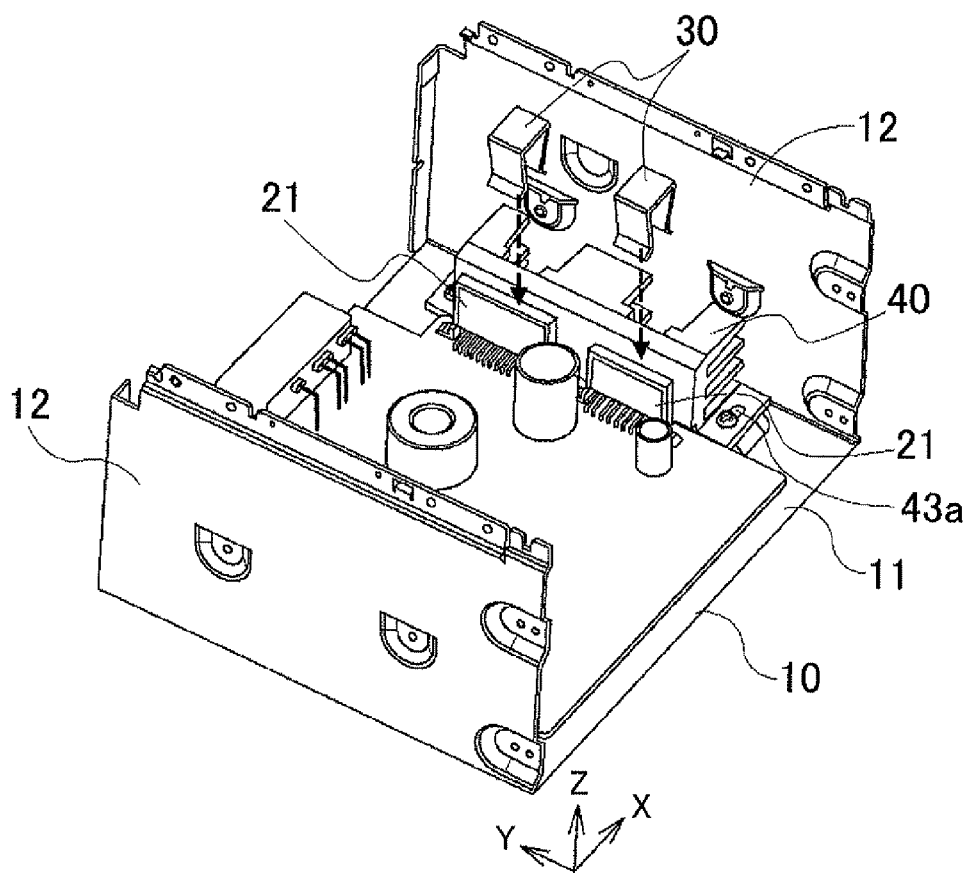
Figure 5B:
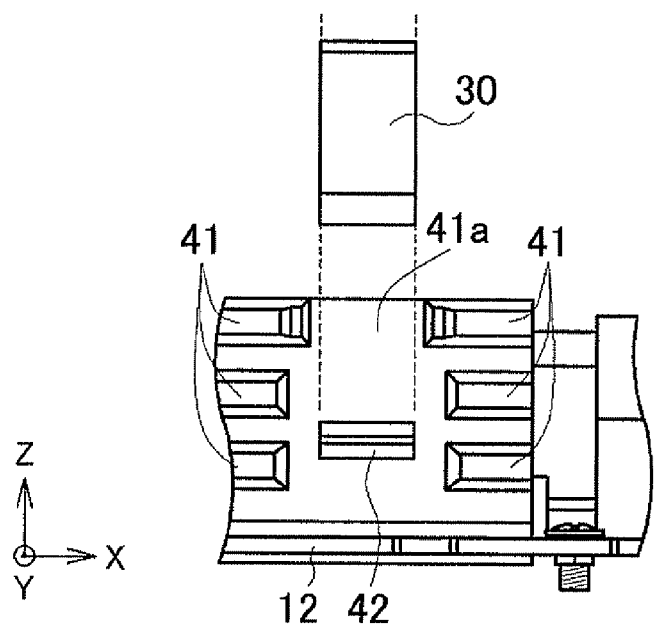
Figure 6:
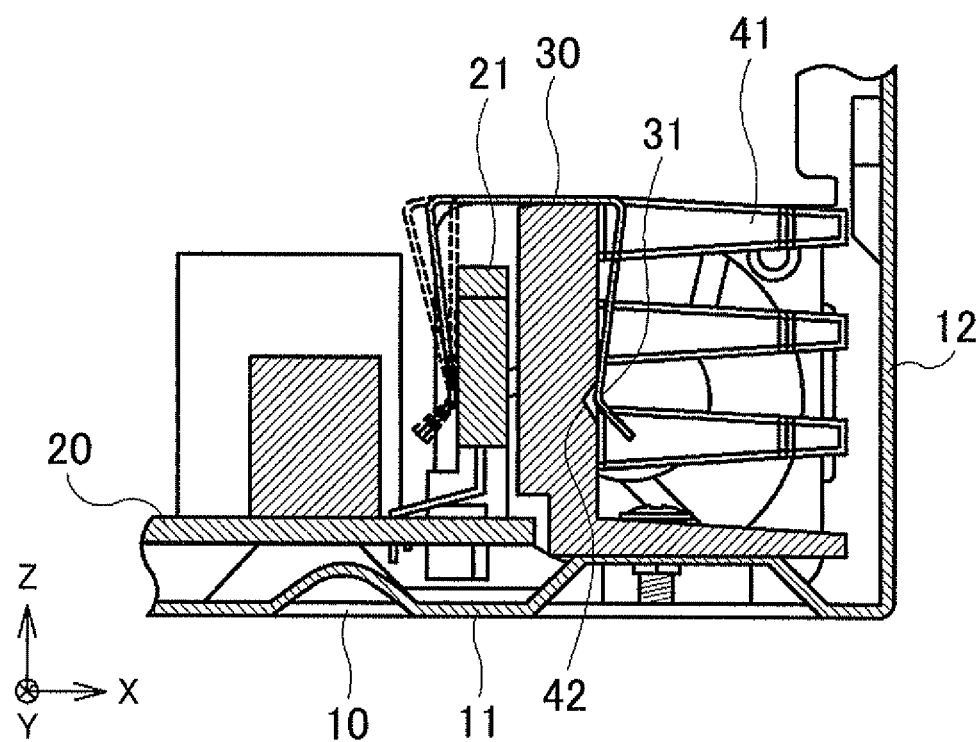
FIG. 6 is an enlarged side cross-sectional view showing a state after the fixing process is performed.

FIGS. 5A and 5B are views illustrating a fixing process in which the heat source elements 21 and the heat sink 40 are fixed to each other. FIG. 5A is a perspective view showing a process in which the clips 30 are moved toward the heat source elements 21 and the heat sink 40. FIG. 5B is an enlarged side view showing the process in which the clips 30 are moved toward the heat source elements 21 and the heat sink 40. FIG. 6 is an enlarged side cross-sectional view showing a state after the fixing process is performed.

As shown in FIGS. 5A and 5B, the clips 30 are moved toward the heat source elements 21 and the heat sink 40, which have been brought into abutment with each other in the abutting process, along the direction (in FIGS. 5A and 5B, Z direction) that is generally orthogonal to the bottom surface portion 11. The clips 30 are thus disposed at positions at which the clips 30 hold the heat source elements 21 and the heat sink 40. In the example, two heat source elements 21 and a single heat sink 40 have been brought into abutment with each other in the abutting process. Thus, as shown in FIG. 5A, a single clip 30 is disposed for each of the two heat source elements 21. When moving the clips 30 toward their holding positions, as shown in FIG. 5B, the portions that surround the notched portions 41a of the heat radiating fin 41 that is first approached by the clips 30 restrict movement of the clips 30 in directions (in FIG. 5B, Y direction, for example) other than the moving direction of the clips 30. Thus, the clips 30 can be disposed at appropriate positions. Further, the notched portions 41a provided in the heat radiating fin 41 that is first approached by the clips 30 are formed to have a width that is smaller than the width of the notched portions 41a in the other heat radiating fins 41. Thus, the clips 30 are prevented from being caught by the heat radiating fins 41 other than the heat radiating fin 41 that is first approached by the clips 30 when the clips 30 are moved toward their holding positions. Thus, the clips 30 can be disposed at their holding positions easily. The clips 30 can be disposed at their holding positions by moving the clips 30 until the projecting portions 31 of the clips 30 are fitted with the recesses 42 of the heat sink 40 as shown in FIG. 6. This allows the heat source elements 21 and the heat sink 40 to be fixed to each other through the elastic force of the clips 30.

Variations in fixing position due to the dimensional tolerance and the assembly tolerance of the heat source elements 21 and the heat sink 40 are absorbed through deformation of the clips 30. The heat source elements 21 and the heat sink 40 may be subjected to dimensional variations due to temperature variations, and may receive an external force due to vibration. Even in such cases, an elastic force is applied from the clips 30 to the heat source elements 21 and the heat sink 40 at all times to securely keep the heat source elements 21 and the heat sink 40 in the fixed state. When or after the clips 30 are moved to their holding positions, the clips 30 may be displaced or deformed because of play between the projections 31 of the clips 30 and the recesses 42 of the heat sink 40, for example, to move the end portions of the clips 30. As indicated by the dotted lines in FIG. 6, however, the clips 30 are movable in a range in which there are no elements mounted on the circuit board 20 other than the heat source elements 21 or no connection terminals of the heat source elements 21. Thus, the end portions of the clips 30 will not contact such connection terminals to cause a short circuit or the like.

As discussed above, both in the case where the heat sink 40 is accommodated in the housing 10 in the abutting process and in the case where the clips 30 are disposed at their holding positions in the fixing process, the heat sink 40 and the clips 30 can be provided into the housing 10 from an opening portion of the housing 10 along the direction that is generally orthogonal to the bottom surface portion 11, and there is no need to perform work from directions other than the direction that is generally orthogonal to the bottom surface portion 11. Thus, the heat source elements 21 and the heat sink 40 can be fixed to each other through simple and easy working procedures. In particular, even in the case where the side surface portions 12 extending generally orthogonally to the bottom surface portion 11 make it difficult to perform work from directions other than the direction that is generally orthogonal to the bottom surface portion 11 as in the example, the heat sink 40 and the clips 30 can be disposed in the housing 10 easily to achieve a remarkable effect that the heat source elements 21 and the heat sink 40 can be fixed to each other easily.

III. EFFECTS

According to the example described above, the heat sink 40 is moved toward the heat source elements 21 along the direction that is generally orthogonal to the surface of the heat sink 40 for abutment with the heat source elements 21 to be brought into abutment with the heat source elements 21, and the heat source elements 21 and the heat sink 40, which have been brought into abutment with each other, are held by the clips 30 to fix the heat source elements 21 and the heat sink 40 to each other. Thus, it is possible to securely fix the heat source elements 21 and the heat sink 40 to each other through easy work including holding the heat source elements 21 and the heat sink 40 with the clips 30, while absorbing variations in fixing position due to the dimensional tolerance and the assembly tolerance of the heat source elements 21 and the heat sink 40 through deformation of the clips 30.

The heat source elements 21 are mounted on the circuit board 20 such that the surfaces of the heat source elements 21 for abutment with the heat sink 40 extend generally in parallel with the side surface portions 12 of the housing 10, and the clips 30 are moved toward the heat source elements 21 and the heat sink 40 along the direction that is generally orthogonal to the bottom surface portion 11 to be disposed at positions at which the clips 30 hold the heat source element 21 and the heat sink 40. Thus, in order to place the clips 30 at their holding positions, the clips 30 can be provided into the housing 10 along the direction that is generally orthogonal to the bottom surface portion 11, and there is no need to perform work from directions other than the direction that is generally orthogonal to the bottom surface portion 11. Thus, the heat source elements 21 and the heat sink 40 can be fixed to each other through simple and easy working procedures.

The heat sink 40 includes the heat radiating fins 41 extending generally orthogonally to the direction in which the clips 30 are moved toward positions at which the clips 30 hold the heat source elements 21 and the heat sink 40. Each of the heat radiating fins 41 is provided with the notched portions 41a provided along the moving direction of the clips 30 and having a width that is larger than the width of the clips 30. Thus, the heat source elements 21 and the heat sink 40 can be securely fixed to each other by the clips 30 while improving the heat radiation capability through the heat radiating fins 41.

Of the notched portions 41a provided in the plurality of heat radiating fins 41, the notched portions 41a provided in the heat radiating fin 41 that is first approached by the clips 30 when the clips 30 are moved toward positions at which the clips 30 hold the heat source elements 21 and the heat sink 40 have a width that is smaller than the width of the notched portions 41a in the other heat radiating fins 41. Thus, the portions that surround the notched portions 41a of the heat radiating fin 41 that is first approached by the clips 30 restrict movement of the clips 30 in directions other than the moving direction of the clips 30. In addition, the clips 30 are prevented from being caught by the heat radiating fins 41 other than the heat radiating fin 41 that is first approached by the clips 30. Thus, the clips 30 can be disposed at their holding positions easily.

The clips 30 include the projections 31 that are brought into abutment with the heat sink 40 with the clips 30 holding the heat source elements 21 and the heat sink 40, and the heat sink 40 includes the recesses 42 provided in the notched portions 41a to be fitted with the projections 31. Thus, the clips 30 can be disposed at appropriate positions easily and securely.

A plurality of heat source elements 21 are mounted on the circuit board 20, and the plurality of heat source elements 21 and the single heat sink 40 are brought into abutment with each other. Thus, the plurality of heat source elements 21 can be fixed to the heat sink 40 easily with no need to individually position a plurality of heat source elements 21 and a plurality of heat sinks 40 with respect to each other.

The clips 30 are movable in a range in which there are no terminals of the heat source elements 21 for connection with the circuit board 20 or no elements mounted on the circuit board 20 other than the heat source elements 21. Thus, variations in fixing position due to the dimensional tolerance and the assembly tolerance of the heat source elements 21 and the heat sink 40 can be absorbed through movement of the clips 30 while preventing the clips 30 from contacting the elements other than the heat source elements 21 or the connection terminals of the heat source elements 21.

IV. MODIFICATIONS

While various features have been described in conjunction with the examples outlined above, various alternatives, modifications, variations, and/or improvements of those features and/or examples may be possible. Accordingly, the examples, as set forth above, are intended to be illustrative. Various changes may be made without departing from the broad spirit and scope of the underlying inventive principles. The problem to be solved by the inventive principles described herein and the effects of those principles are not limited to those discussed above, and may differ in accordance with the environment in which the principles are implemented and the details of the configuration. Thus, only part of the problem discussed above may be solved, and only some of the effects discussed above may be yielded.

A. Heat Source Element

In the example discussed above, the heat source elements 21 are implemented by an amplifier IC, a power regulator, or the like. However, the heat source elements 21 can be implemented by other components such as a CPU, for example.

B. Heat Sink

In the example discussed above, the heat conducting member is implemented by the heat sink 40 including the plurality of heat radiating fins 41. However, the heat conducting member may be implemented by a heat conducting plate, a heat pipe, or the like that transfers heat to a heat radiating portion provided at a different location. Also in this case, as in the example discussed above, the heat source elements 21 and the heat conducting plate, the heat pipe, or the like, which have been brought into abutment with each other, can be held by the clips 30 to fix the heat source elements 21 and the heat conducting plate, the heat pipe, or the like to each other easily and securely.

In the example discussed above, the heat radiating fins 41 are formed as generally flat plates extending generally orthogonally to the direction in which the clips 30 are moved toward positions at which the clips 30 hold the heat source elements 21 and the heat sink 40. However, the heat radiating fins 41 may be provided to extend along a different direction. For example, the heat radiating fins 41 may be formed as generally flat plates extending generally in parallel with the direction in which the clips 30 are moved toward positions at which the clips 30 hold the heat source elements 21 and the heat sink 40.

In the example discussed above, of the notched portions 41a provided in the heat radiating fins 41, the notched portions 41a provided in the heat radiating fins 41 other than the heat radiating fin 41 that is first approached by the clips 30 when the clips 30 are moved toward their holding positions are all formed to have the same width. However, the notched portions 41a provided in such heat radiating fins 41 may have different widths. For example, the notched portions 41a provided in such heat radiating fins 41 may have widths that become larger in the order (from top to bottom in FIGS. 3A and 3C) of being approached by the clips 30 when the clips 30 are moved toward their holding positions.

C. Clip

In the example discussed above, the heat source elements 21 are fixed to the heat sink 40 using the separate clips 30. However, a plurality of heat source elements 21 may be fixed to the heat sink 40 using a single clip 30. Alternatively, a single heat source element 21 may be fixed to the heat sink 40 using a plurality of clips 30.

D. Fan

In the example discussed above, the fan 50 is disposed at a side of the heat sink 40 and at a position at which the fan 50 can discharge air inside the housing 10 out of the housing 10. However, the fan 50 may be disposed at a side of the heat sink 40 and at a position at which the fan 50 can introduce air outside the housing 10 into the housing 10.

What is claimed is:

1. An electronic device mounted on a circuit board and accommodated in a housing, the electronic device comprising:
    a heat source element accommodated in the housing and mounted on the circuit board;
    a heat conducting member accommodated in the housing, the heat conducting member being movably mounted on the circuit board;
    an elastic member fixing the heat source element and the heat conducting member in abutment with each other, the elasticity of the elastic member permitting variations in the relative positions of the heat source element and the heat conducting member while maintaining the abutment of the heat source element and the heat conducting member; and
    a plurality of heat radiating fins provided on the heat conducting member, each of the plurality of heat radiating fins having a notched portion, each notched portion extending along an insertion direction in which the elastic member is inserted onto the heat conducting member, each notched portion having a width in a direction substantially perpendicular to the insertion direction that is larger than a width of the elastic member in the direction substantially perpendicular to the insertion direction, the width of a first notched portion provided in the heat radiating fin that is first approached by the elastic member when the elastic member is inserted onto the heat source element being smaller than the width of a second notched portion that is second approached by the elastic member when the elastic member is inserted onto the heat source.

2. The electronic device according to claim 1, wherein:
    the heat conducting member includes a recess provided in the notched portions; and
    the elastic member includes a projection that is seated in the recess.

3. The electronic device according to claim 1, wherein:
    the heat conducting member includes a recess; and
    the elastic member includes a projection that is seated in the recess.

4. The electronic device according to claim 1, further comprising:
    a plurality of the heat source elements mounted on the circuit board; and
    a plurality of the elastic members, each elastic member fixing one of the plurality of the heat source elements and the heat conducting member in abutment with each other, the elasticity of each elastic member permitting variations in the relative positions of each heat source element and the heat conducting member while maintaining the abutment of each heat source element and the heat conducting member.

5. The electronic device according to claim 1, wherein:
    the elastic member is movable in a range in which there are no terminals of the heat source element for connection with the circuit board or no elements mounted on the circuit board other than the heat source element.

6. The electronic device according to claim 1, wherein the heat conducting member is a heat pipe.

7. The electronic device of claim 1, wherein the electronic device is an audio device.

8. The electronic device of claim 1, wherein the electronic device is a navigation device.

9. A method of fixing a heat source element and a heat conducting member that are mounted on a circuit board and accommodated in a housing, the method comprising:
    moving the heat conducting member toward the heat source element;
    abutting the heat conducting member against the heat source element; and
    fixing the heat source element and the heat conducting member in abutment with each other with an elastic member, the elasticity of the elastic member permitting variations in the relative positions of the heat source element and the heat conducting member while maintaining the abutment of the heat source element and the heat conducting member;
    wherein the heat conducting member includes a plurality of heat radiating fins, each of the plurality of heat radiating fins having a notched portion, each notched portion extending along an insertion direction in which the elastic member is inserted onto the heat conducting member, each notched portion having a width in a direction substantially perpendicular to the insertion direction that is larger than a width of the elastic member in the direction substantially perpendicular to the insertion direction, the width of a first notched portion provided in the heat radiating fin that is first approached by the elastic member when the elastic member is inserted onto the heat source element being smaller than the width of a second notched portion that is second approached by the elastic member when the elastic member is inserted onto the heat source.

10. The method of fixing the heat source element and the heat conducting member according to claim 9, further comprising moving the heat conducting member toward the heat source element along a direction that is generally perpendicular to an abutment surface of the heat conducting member.

11. The method of fixing the heat source element and the heat conducting member according to claim 9, wherein:
    the housing includes a bottom surface portion;
    the circuit board is fixed to the housing so as to extend generally parallel with the bottom surface portion;
    the abutment surface extends generally perpendicular to the bottom surface portion; and
    the method further comprises moving the elastic member toward the heat source element and the heat conducting member along a direction that is generally perpendicular to the bottom surface portion to fix the heat source element and the heat conducting member in abutment with each other.

12. The method of fixing the heat source element and the heat conducting member according to claim 9, wherein:
    the heat conducting member includes a recess provided in the notched portions; and
    the method further comprises seating a projection of the elastic member in the recess.

13. The method of fixing the heat source element and the heat conducting member according to claim 9, wherein:
    the heat conducting member includes a recess; and
    the method further comprises seating a projection of the elastic member in the recess.

14. The method of fixing the heat source element and the heat conducting member according to claim 9, wherein:
- a plurality of the heat source elements are mounted on the circuit board; and
- the method further comprises fixing each one of the plurality of the heat source elements and the heat conducting member in abutment with each other with one of a plurality of the elastic members, the elasticity of each elastic member permitting variations in the relative positions of each heat source element and the heat conducting member while maintaining the abutment of each heat source element and the heat conducting member.

15. The method of fixing the heat source element and the heat conducting member according to claim 9, wherein:
- the elastic member is movable in a range in which there are no terminals of the heat source element for connection with the circuit board or no elements mounted on the circuit board other than the heat source element.

16. The method of fixing the heat source element and the heat conducting member according to claim 9, wherein the heat conducting member is a heat pipe.

* * * * *